(12) United States Patent
Fujiwara et al.

(10) Patent No.: US 10,878,894 B2
(45) Date of Patent: Dec. 29, 2020

(54) MEMORY DEVICE HAVING LOW BITLINE VOLTAGE SWING IN READ PORT AND METHOD FOR READING MEMORY CELL

(71) Applicant: TAIWAN SEMICONDUCTOR MANUFACTURING COMPANY LTD., Hsinchu (TW)

(72) Inventors: Hidehiro Fujiwara, Hsin-Chu (TW); Haruki Mori, Hsinchu (TW); Chih-Yu Lin, Taichung (TW); Yen-Huei Chen, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/521,446

(22) Filed: Jul. 24, 2019

(65) Prior Publication Data

US 2020/0066333 A1    Feb. 27, 2020

Related U.S. Application Data

(60) Provisional application No. 62/711,865, filed on Jul. 30, 2018.

(51) Int. Cl.
| | |
|---|---|
| *G11C 7/10* | (2006.01) |
| *G11C 11/412* | (2006.01) |
| *G11C 8/16* | (2006.01) |
| *G11C 11/419* | (2006.01) |
| *G11C 11/418* | (2006.01) |
| *G11C 7/12* | (2006.01) |

(Continued)

(52) U.S. Cl.
CPC .............. *G11C 11/419* (2013.01); *G11C 5/147* (2013.01); *G11C 7/1063* (2013.01); *G11C 7/1075* (2013.01); *G11C 7/12* (2013.01); *G11C 8/08* (2013.01); *G11C 8/16* (2013.01); *G11C 11/412* (2013.01); *G11C 11/418* (2013.01)

(58) Field of Classification Search
CPC ........ G11C 8/16; G11C 7/1075; G11C 11/412
USPC ....................................... 365/230.05, 189.04
See application file for complete search history.

(56) References Cited

U.S. PATENT DOCUMENTS

| | | | |
|---|---|---|---|
| 7,495,948 B2* | 2/2009 | Suzuki | G11O 5/14 365/154 |
| 7,684,274 B2* | 3/2010 | Rengarajan | G11C 7/02 365/154 |

(Continued)

*Primary Examiner* — Son L Mai
(74) *Attorney, Agent, or Firm* — WPAT, P.C., Intellectual Property Attorneys; Anthony King

(57) ABSTRACT

A memory device includes memory cells and a control circuit. Each memory cell includes a first inverter, a second inverter, a first transistor and a second transistor. The first and second inverters are cross-coupled between a first data node and a second data node. The first transistor has a first control terminal coupled to a wordline, a first connection terminal coupled to a bitline, and a second connection terminal. The second transistor has a second control terminal, a third connection terminal and a fourth connection terminal. The second control terminal is coupled to the first data node. The third connection terminal is coupled to the second connection terminal. The control circuit is coupled to the fourth connection terminal, and is configured to, when the bitline is selected, adjust a voltage level at the fourth connection terminal in response to activation of the wordline.

20 Claims, 8 Drawing Sheets

(51) Int. Cl.
*G11C 8/08* (2006.01)
*G11C 5/14* (2006.01)

(56) References Cited

U.S. PATENT DOCUMENTS

| | | | | |
|---|---|---|---|---|
| 7,986,566 B2* | 7/2011 | Houston | ............. | G11C 7/1051 |
| | | | | 365/189.05 |
| 8,339,886 B2* | 12/2012 | Wang | ................... | G11C 11/419 |
| | | | | 365/205 |
| 8,654,575 B2* | 2/2014 | Deng | ................... | G11C 11/412 |
| | | | | 365/154 |
| 9,171,634 B2* | 10/2015 | Zheng | ................... | G11C 16/28 |
| 9,627,042 B2* | 4/2017 | Mazumder | ............ | G11C 11/419 |

* cited by examiner

MEMORY DEVICE HAVING LOW BITLINE VOLTAGE SWING IN READ PORT AND METHOD FOR READING MEMORY CELL

PRIORITY CLAIM AND CROSS-REFERENCE

The present application claims priority to U.S. Provisional Patent Application No. 62/711,865, filed on Jul. 30, 2018, which is incorporated by reference herein in its entirety.

BACKGROUND

The present disclosure relates to a memory device and, more particularly, to a static random access memory (SRAM) device having a low bitline voltage swing in a read port and a method for reading an SRAM cell.

SRAM devices have become increasingly popular in various applications, such as communication, image processing and other system-on-chip (SOC) applications, which require high speed operation and low power dissipation. As sub-threshold (or near-threshold) circuit designs are prevalent for ultra-low power applications, SRAM devices suitable for sub-threshold operation are proposed in recent years. For example, some sub-threshold SRAM designs utilize a 10-transistor (10-T) SRAM cell, having separated read and write ports, for operation at sub-threshold voltages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
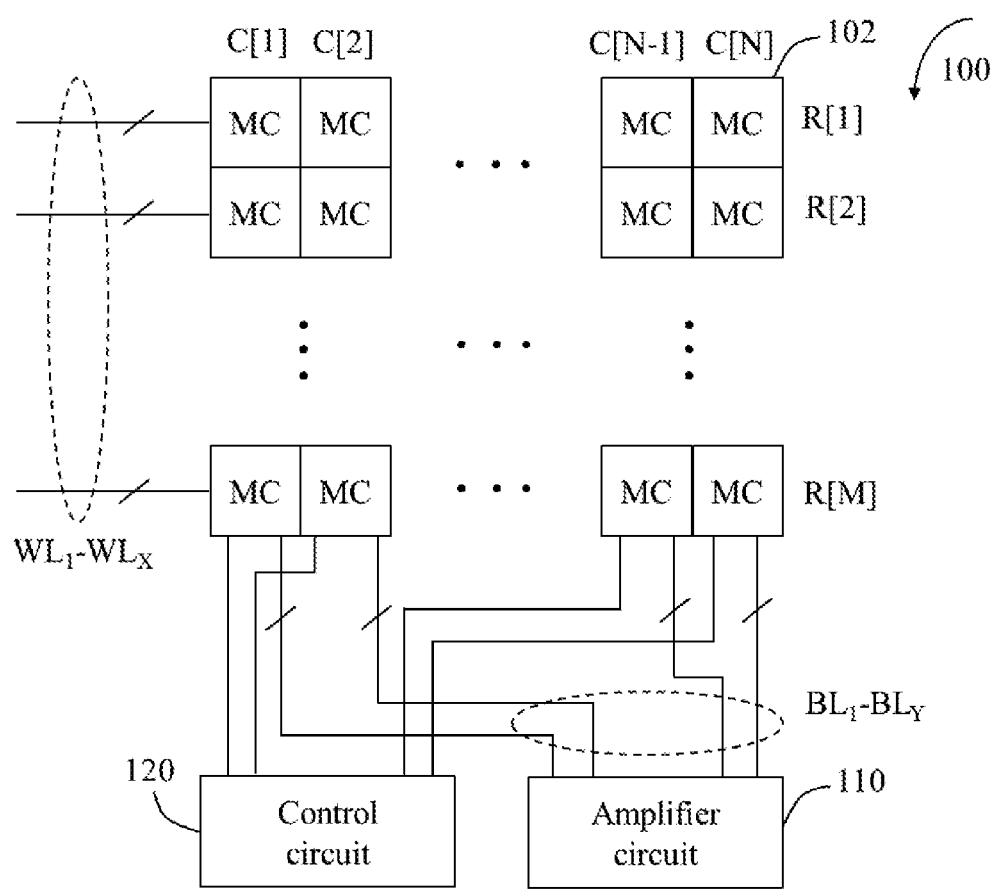
FIG. 1 is a diagram illustrating an exemplary memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

In the below description, a signal is asserted with a logical high value to activate a corresponding device when the device is active high. In contrast, the signal is deasserted with a low logical value to deactivate the corresponding device. When the device is active low, however, the signal is asserted with a low logical value to activate the device, and is deasserted with a high logical value to deactivate the device.

The present disclosure describes exemplary memory devices, such as a static random access memory (SRAM) device having two-port SRAM cells or an SRAM device having 10-transistor (10T) SRAM cells. These exemplary memory devices can adjust a voltage in a port (e.g. a read port) in response to wordline assertion to reduce/suppress bitline voltage swings during read operations. The present disclosure further describes exemplary methods for reading memory cells of the memory devices. In some embodiments, the memory devices can cause a voltage level on a signal line in the port to change towards a voltage level on an associated bitline, thereby reducing a bitline voltage swing. In some embodiments, the memory devices may cause a signal line in the port to float with an associated bitline, thereby reducing a bitline voltage swing.

FIG. 1 is a diagram illustrating an exemplary memory device 100 according to an embodiment of the present disclosure. The memory device 100 can be implemented by a single-port, dual-port or multi-port (e.g. two-port) SRAM device. A single-port SRAM device has one data/address port and one output port, and supports sequential read and write operations. A two-port SRAM device has two data/address ports and one output port, and supports simultaneous read and write operations at a same clock rate. A dual-port SRAM device has two data/address ports and two output ports, and supports simultaneous read and write operations to different addresses at two clock rates.

In the embodiment shown in FIG. 1, the memory device 100 includes a plurality of wordlines $WL_1$-$WL_X$, a plurality of bitlines $BL_1$-$BL_Y$, a memory cell array 102, an amplifier circuit 110 and a control circuit 120, wherein each of X and Y is a positive integer greater than one. The memory cell array 102 has a plurality of memory cells MC arranged in columns C[1]-C[N] and rows R[1]-R[M], wherein each of N and M is a positive integer greater than one. The memory cells MC are coupled to the wordlines $WL_1$-$WL_X$ and the bitlines $BL_1$-$BL_Y$. Memory cells in a column (or a column of memory cells) can be coupled to a same bitline or same bitlines such as a pair of complementary bitlines. When a column is selected, it implies that a bitline coupled to the column is selected. In addition, Memory cells in a row (or a row of memory cells) can be coupled to a same wordlines or same wordlines such as a pair of complementary wordlines. When a row is selected, it implies that a wordline coupled to the row is selected.

The amplifier circuit 110 is coupled to the N columns of memory cells MC of the memory cell array 102 via the bitlines $BL_1$-$BL_Y$. The amplifier circuit 110 is configured to amplify voltage signals on the bitlines $BL_1$-$BL_Y$. In some embodiments, when a row of memory cells is selected during a read operation, the enable timing of the amplifier circuit 110 may be determined according to the worst-case cell within the selected row of memory cells in order to ensure a sufficient signal differential, or signal strength, is created. By way of example but not limitation, a six-sigma (6σ) quality-of-performance method can be employed to determine process tolerances. To achieve the 6σ-yield specification in the memory cell array 102, all cells should tolerate a 6σ variation in operational modes, including read, write and standby modes. The worst-case cell would correspond to a 6σ process variation.

The control circuit 120 is coupled to the N columns of memory cells MC of the memory cell array 102 via N signal lines $SL_1$-$SL_N$. The control circuit 120 is configured to selectively adjust a voltage level on a signal line, which is coupled to a selected bitline, to thereby limit/reduce a voltage swing on the selected bitline. By way of example but not limitation, when a read bitline coupled to a column of memory cells is selected, the control circuit 120 is configured to, in response to activation of a read wordline coupled to the column of memory cells, adjust a voltage level on a signal line coupled to the selected read bitline. In some embodiments, the control circuit 120 may be configured to change the voltage level on the signal line (coupled to the selected read bitline) towards a voltage level on the selected read bitline such that the memory device 100 can have a low voltage swing on the selected read bitline. Hence, even if the memory device 100 is employed in near-threshold operation, all or most all of normal memory cells may not be fully discharged before the amplifier circuit 110 is enabled. Further description is provided below.

Figure 2:
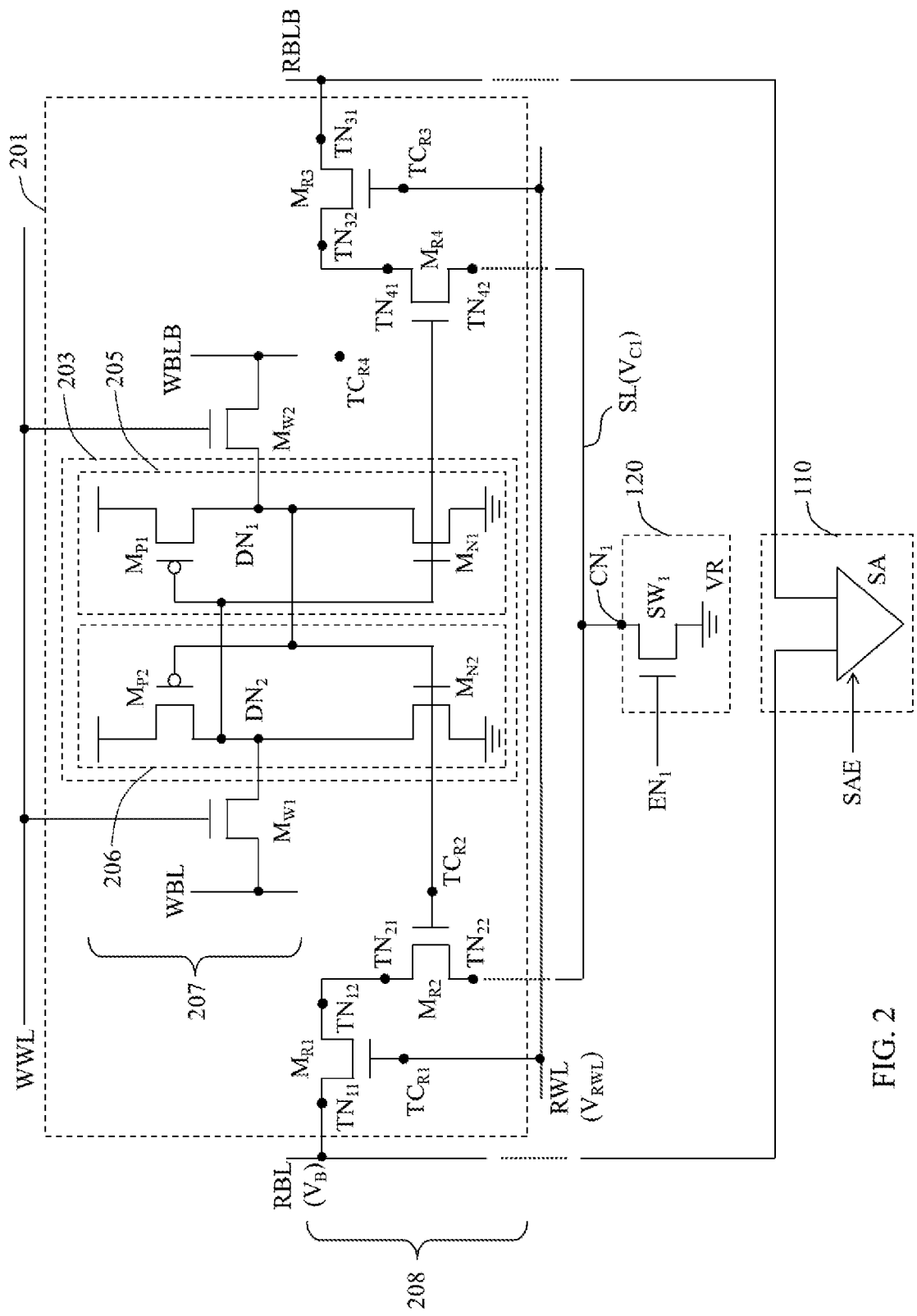
FIG. 2 is a circuit diagram illustrating an exemplary memory cell coupled to an amplifier circuit and a control circuit shown in FIG. 1 in accordance with some embodiments.

FIG. 2 is a circuit diagram illustrating an exemplary memory cell coupled to the amplifier circuit 110 and the control circuit 120 shown in FIG. 1 according to an embodiment of the present disclosure. In this embodiment, the memory cell 201 includes a two-port SRAM cell. The memory cell 201 is coupled to a write wordline WWL (e.g. one of the wordlines $WL_1$-$WL_X$ shown in FIG. 1), a write bitline WBL (e.g. one of the bitlines $BL_1$-$BL_Y$ shown in FIG. 1), a complementary write bitline WBLB (e.g. one of the bitlines $BL_1$-$BL_Y$ shown in FIG. 1), a read wordline RWL (e.g. one of the wordlines $WL_1$-$WL_X$ shown in FIG. 1), a read bitline RBL (e.g. one of the bitlines $BL_1$-$BL_Y$ shown in FIG. 1), and a complementary read bitline RBLB (e.g. one of the bitlines $BL_1$-$BL_Y$ shown in FIG. 1).

The memory cell 201 includes a latch 203, a write port portion 207 and a read port portion 208. The latch 203 has a data node $DN_1$ and a data node $DN_2$, which is a complementary data node of the data node DN1, for data storage. In the embodiment shown in FIG. 2, the latch 203 includes a plurality of transistors $M_{P1}$, $M_{P2}$, $M_{N1}$ and $M_{N2}$, each of which can serve as a switch. The transistors $M_{P1}$ and $M_{N1}$ form an inverter 205, and the transistors $M_{P2}$ and $M_{N2}$ form an inverter 206. In addition, the inverters 205 and 206 are cross-coupled between the data nodes $DN_1$ and $DN_2$ for data storage.

The write port portion 207 includes a plurality of transistors $M_{W1}$ and $M_{W2}$. Each of the transistors $M_{W1}$ and $M_{W2}$ serves as a switch, and is controlled according to activation/assertion of the write wordline WWL. In operation, the transistor $M_{W1}$ is configured to selectively couple the write bitline WBL to the data node $DN_2$, while the transistor $M_{W2}$ is configured to selectively couple the complementary write bitline WBLB to the data node $DN_1$.

The read port portion 208 includes a plurality of transistors $M_{R1}$-$M_{R4}$, each of which can serves as a switch. In the present embodiment, a control terminal $TC_{R1}$ of the transistor $M_{R1}$ is coupled to the read wordline RWL, a connection terminal $TN_{11}$ of the transistor $M_{R1}$ is coupled to the read bitline RBL, and a connection terminal $TN_{12}$ of the transistor $M_{R1}$ is coupled to a connection terminal $TN_{21}$ of the transistor $M_{R2}$. Additionally, a control terminal $TC_{R2}$ of the transistor $M_{R2}$ is coupled to the data node $DN_1$, and a connection terminal $TN_{22}$ of the transistor $M_{R2}$ is coupled to the control circuit 120. Similarly, a control terminal $TC_{R3}$ of the transistor $M_{R3}$ is coupled to the read wordline RWL, a connection terminal $TN_{31}$ of the transistor $M_{R3}$ is coupled to the complementary read bitline RBLB, and a connection terminal $TN_{32}$ of the transistor $M_{R3}$ is coupled to a connection terminal $TN_{41}$ of the transistor $M_{R4}$. A control terminal $TC_{R4}$ of the transistor $M_{R4}$ is coupled to the data node $DN_2$, and a connection terminal $TN_{42}$ of the transistor $M_{R4}$ is coupled to the control circuit 120.

Each of the transistors $M_{R1}$ and $M_{R3}$ is controlled according to activation/assertion of the read wordline RWL. In operation, the transistor $M_{R1}$ is configured to selectively couple the read bitline RBL to the transistor $M_{R2}$, and the transistor $M_{R3}$ is configured to selectively couple the complementary read bitline RBLB to the transistor $M_{R4}$.

In the embodiment shown in FIG. 2, the amplifier circuit 110 may include a sense amplifier SA, wherein the sense amplifier SA is configured to amplify a voltage differential on the read bitline RBL and the complementary read bitline RBLB according to a sense enable signal SAE.

The control circuit 120 is coupled to the connection terminals $TN_{22}$ and $TN_{42}$. In operation, the control circuit 120 is configured to, when the read bitline RBL is selected, adjust a voltage level at the connection terminal $TN_{22}$ in response to activation of the read wordline RWL. In the embodiment shown in FIG. 2, the control circuit 120 may include, but is not limited to, a circuit node $CN_1$ and a control switch $SW_1$. The circuit node $CN_1$ is coupled to the connection terminals $TN_{22}$ and $TN_{42}$ through a signal line SL. In some embodiments, each memory cell illustrated in FIG. 1 can employ the structure of the memory cell 201. As a result, the circuit node $CN_1$, or the signal line SL, can be shared by a column of memory cells since the circuit node $CN_1$ is coupled to the column of memory cells through corresponding connection terminals of the column of memory cells (e.g. the connection terminal $TN_{22}$/$TN_{42}$ of each memory cell of the column of memory cells).

The control switch $SW_1$ includes a transistor. In operation, the control switch $SW_1$ is arranged for selectively coupling the circuit node $CN_1$ to a reference voltage VR to thereby selectively couple the connection terminal $TN_{22}$/$TN_{42}$, or the signal line SL, to the reference voltage VR. In some embodiments, when the read bitline RBL coupled to the memory cell 201 is selected, the control switch $SW_1$ is configured to selectively couple the circuit node $CN_1$ to the reference voltage VR, such as a ground voltage, in response to activation of the read wordline RWL, thereby adjusting a voltage level at the circuit node $CN_1$. As a result, the control circuit 120 may utilize the control switch $SW_1$ to adjust a voltage level $V_{C1}$ on the signal line SL, wherein the signal line SL can be shared by a column of memory cells including the Memory cell 201.

Figure 3:
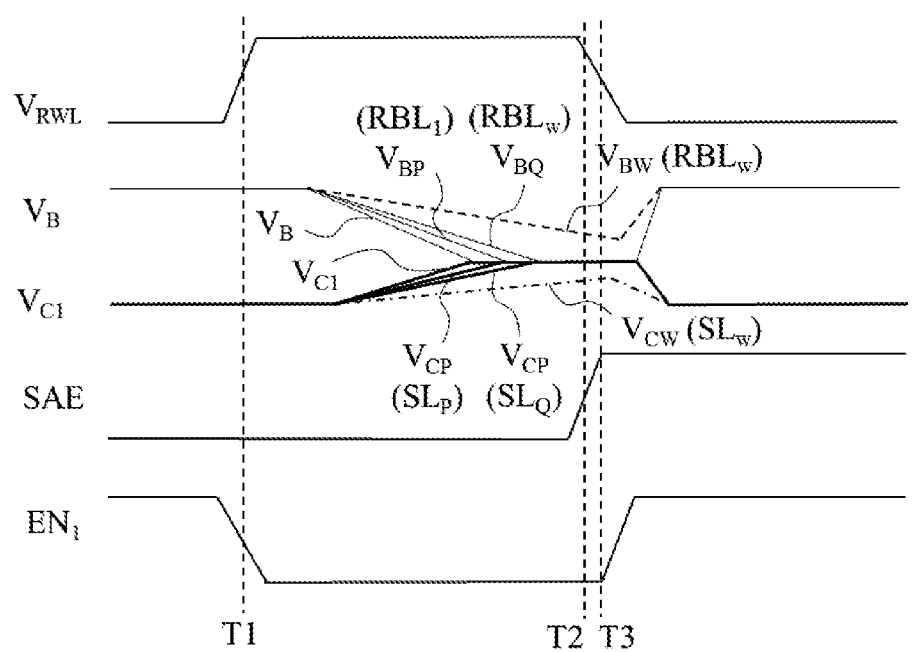
FIG. 3 illustrates exemplary waveforms of signals involved in operations for reading the memory cell shown in FIG. 2 in accordance with some embodiments.

In some embodiments, when the read bitline RBL is selected and the read wordline RWL is activated, the control circuit 120 causes the voltage level at the connection terminal $TN_{22}$ to change towards a voltage level on the read bitline RBL. FIG. 3 illustrates exemplary waveforms of signals involved in operations for reading the memory cell 201 shown in FIG. 2 according to an embodiment of the present disclosure. In the embodiment shown in FIG. 3, during a read operation, the read bitline RBL is selected to read the memory cell 201. Referring to FIG. 3 and also to FIG. 2, before time T1, the read wordline RWL is kept inactivated (a voltage level $V_{RWL}$ is low), and the control switch $SW_1$ turns on according to a control signal EN so as to couple the circuit node $CN_1$ to the reference voltage VR. As a result, the voltage level $V_{C1}$ on the signal line SL is pulled up towards the reference voltage VR. During a period of time when the read bitline RBL is selected and the read wordline RWL is activated, i.e. a time period between time T1 and time T3, the control switch $SW_1$ uncouples the circuit node $CN_1$ from the reference voltage VR so as to cause the voltage level at the circuit node $CN_1$ to float with the voltage level $V_B$ on the selected read bitline RBL. As illustrated in FIG. 3, during a period of time when the read wordline RWL is activated/asserted, the voltage level $V_{C1}$ on the signal line SL increases from a voltage level of the reference voltage VR, thus reducing/limiting a voltage swing on the read bitline RBL.

For illustrative purposes, respective voltage levels $V_{BP}$, $V_{BQ}$ and $V_{BW}$ on other selected read bitlines $RBL_P$, $RBL_Q$ and $RBL_W$, and respective voltage levels $V_{CP}$, $V_{CQ}$ and $V_{CW}$ on other signal lines $SL_P$, $SL_Q$ and $SL_W$ are also shown in FIG. 3. The read bitlines RBL, $RBL_P$, $RBL_Q$ and $RBL_W$ are separated from each other, and disposed in correspondence with different columns. In the embodiment shown in FIG. 3, memory cells coupled to the read bitlines RBL, $RBL_P$, $RBL_Q$ and $RBL_W$ are coupled to the same read wordline RWL. The memory cells coupled to the read bitlines RBL, RBL and $RBL_Q$ are normally cells, while the memory cell coupled to the read bitline $RBL_W$ is a worst-case cell, corresponding to a 6σ variation. In addition, the signal lines $SL_P$, $SL_Q$ and $SL_W$ are respectively coupled to the memory cells, which are coupled to the read bitlines RBL, RBL and $RBL_Q$, in a manner similar/identical to that the signal line SL is coupled to the memory cell 201 shown in FIG. 2.

As illustrated in FIG. 3, before a sufficient voltage drop is induced on the read bitline $RBL_W$ coupled to the worst-case cell, respective voltage swings on the read bitlines RBL, RBL and $RBL_Q$ are limited since respective voltage levels $V_{C1}$, $V_{CP}$ and $V_{CQ}$ on the signal lines SL, $SL_P$ and $SL_Q$ float with the voltage levels $V_B$, $V_{BP}$ and $V_{BQ}$ respectively, thus greatly reducing power consumption.

At time T2, a sufficient voltage drop is induced on the read bitline $RBL_W$. The sense amplifier SA is trigged by the sense enable signal SAE to amplify a voltage differential between the read bitline RBL and the complementary read bitline RBLB. Next, when the read wordline RWL is inactivated at time T3, the control switch $SW_1$ can turn on again to couple the circuit node $CN_1$ to the reference voltage VR.

By dynamically adjusting a voltage level on a signal line being coupled to a selected bitline when an associated wordline is activated, a voltage swing in a normal cell can be effectively limited/reduced. Hence, even if an SRAM device is employed in near-threshold operation, all or most all of normal memory cells therein would not be fully discharged before a sufficient voltage drop is induced on a bitline coupled to the worst-case cell. Compared with a conventional SRAM device where most of the bitlines are fully discharged in near-threshold operation, the floating footer control scheme as described above can greatly reduce power consumption in ultra-low voltage operation of an SRAM cell such as a 10-T SRAM cell.

Figure 4:
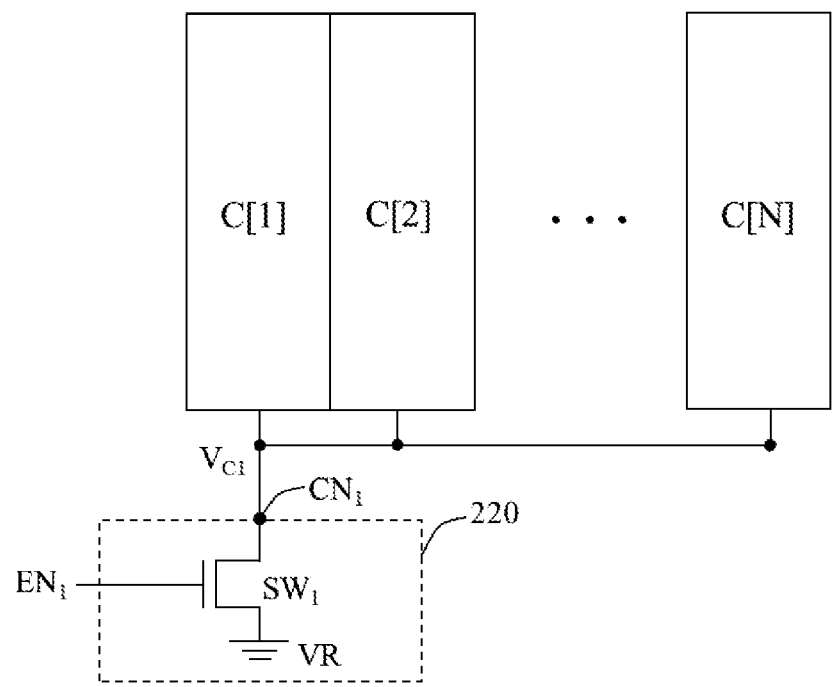
FIG. 4 illustrates exemplary connection between the control circuit and N columns shown in FIG. 1 in accordance with some embodiments.

In some embodiments, a plurality of columns of memory cells may share a same control switch. Refer to FIG. 4, which illustrates exemplary connection between the control circuit 120 and the N columns C[1]-C[N] shown in FIG. 1 according to an embodiment of the present disclosure. Each of the N columns C[1]-C[N] may represent a column of memory cells. In the embodiment shown in FIG. 4, each memory cell in the N columns C[1]-C[N] can employ the structure of the memory cell 201 shown in FIG. 2, and the control circuit 120 shown in FIG. 2 can be used to control the N columns C[1]-C[N]. The circuit node $CN_1$ is shared by the N columns of memory cells through corresponding connection terminals of each column of memory cells, e.g. the connection terminal $TN_{22}/TN_{42}$ shown in FIG. 2. Hence, the control circuit 120 can be configured to adjust the voltage level $VC_1$ so as to simultaneously control/adjust voltage levels at the corresponding connection terminals.

Figure 5:
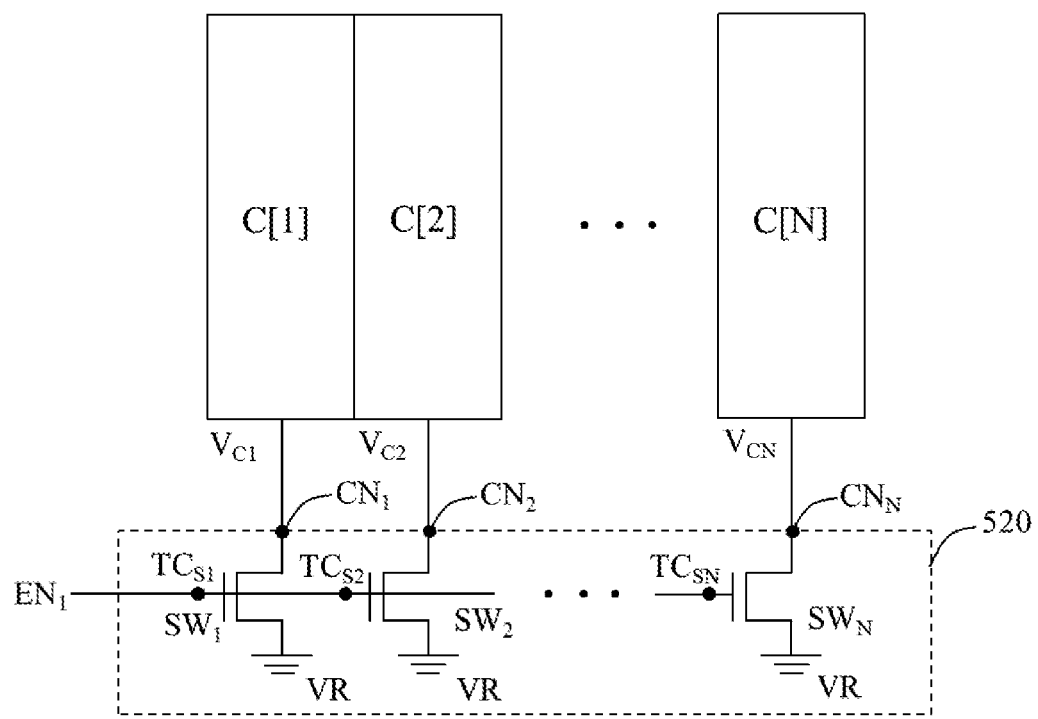
FIG. 5 illustrates exemplary connection between the control circuit and the N columns shown in FIG. 1 in accordance with some embodiments.

FIG. 5 illustrates exemplary connection between the control circuit 120 and the N columns C[1]-C[N] shown in FIG. 1 according to another embodiment of the present disclosure. The control circuit 520 can represent an exemplary embodiment of the control circuit 120 shown in FIG. 1. The difference between the structure shown in FIG. 5 and the structure shown in FIG. 4 is that the control circuit 520 further includes circuit nodes $CN_2$-$CN_N$ and control switches $SW_2$-$SW_N$. The circuit nodes $CN_1$-$CN_N$ are separated from each other. In operation, the control circuit 520 is arranged to control voltage levels $VC_1$-$VC_N$ on respective signal lines in read ports in the columns C[1]-C[N]. In some embodiments, the voltage levels $VC_1$-$VC_N$ may be different from each other.

In the present embodiment, each memory cell in the N columns C[1]-C[N] can employ the structure of the memory cell 201 shown in FIG. 2. Each of the circuit nodes $CN_1$-$CN_N$ is shared by a corresponding column of memory cells through corresponding connection terminals of the corresponding column of memory cells. For example, the circuit node $CN_1$ is shared by memory cells in the column C[1] through respective connection terminals, e.g. the connection terminal $TN_{22}/TN_{42}$ shown in FIG. 2, of the memory cells in the column C[1]. The circuit node $CN_2$ is shared by memory cells in the column C[2] through respective connection terminals, e.g. the connection terminal $TN_{22}/TN_{42}$ shown in FIG. 2, of the memory cells in the column C[2], and so on. As a result, when a read bitline coupled to a memory cell in the column C[1] is selected, the control switch $SW_1$ is configured to selectively couple the circuit node $CN_1$ to the reference voltage VR in response to activation of a read wordline coupled to the memory cell, thereby adjusting a voltage level at the circuit node $CN_1$. When a read bitline coupled to a memory cell in the column C[2] is selected, the control switch $SW_2$ is configured to selectively couple the circuit node $CN_2$ to the reference voltage VR in response to activation of a read wordline coupled to the memory cell, thereby adjusting a voltage level at the circuit node $CN_2$, and so on.

The control switches $SW_1$-$SW_N$ can be controlled by the same control signal $EN_1$ to selectively couple the circuit nodes $CN_1$-$CN_N$ to the reference voltage VR. For example, respective control terminals $TC_{S1}$-$TC_{SN}$ of the control switches $SW_1$-$SW_N$ are coupled to each other to receive the same control signal $EN_1$. The control circuit 520 is configured to simultaneously couple the circuit nodes $CN_1$-$CN_N$ to the reference voltage VR according to the same control signal $EN_1$. As a result, in some embodiments where column C[1] is selected and the column C[2] is unselected during activation of a read wordline, the control circuit 520 is configured to simultaneously adjust the voltage level at the circuit node $CN_1$ and the voltage level at the circuit node $CN_2$ in response to activation of a read wordline coupled to the memory cell in the column C[1].

Figure 6:
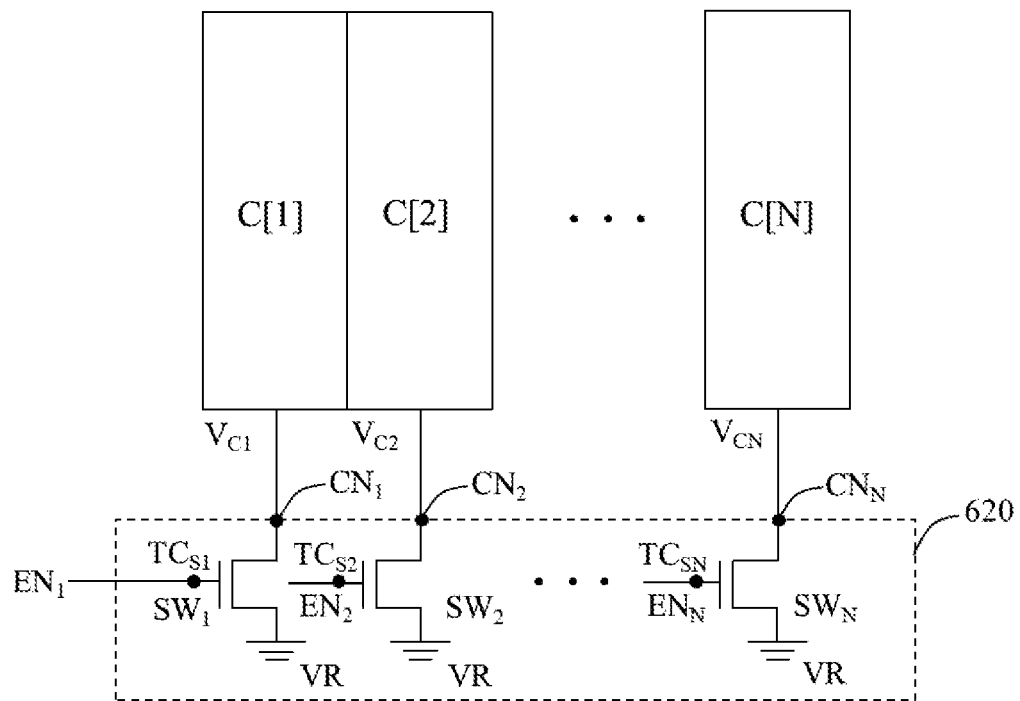
FIG. 6 illustrates exemplary connection between the control circuit and the N columns shown in FIG. 1 in accordance with some embodiments.

FIG. 6 illustrates exemplary connection between the control circuit 120 and the N columns C[1]-C[N] shown in FIG. 1 according to another embodiment of the present disclosure. The difference between the structure shown in FIG. 6 and the structure shown in FIG. 5 is that the respective control terminals $TC_{S1}$-$TC_{SN}$ of the control switches $SW_1$-$SW_N$ shown in FIG. 6 receive different control signals $EN_1$-$EN_N$ respectively. As a result, the control switches $SW_1$-$SW_N$ can be controlled independently of each other. For example, in some embodiments where the column C[1] is selected and the column C[2] is unselected during activation of a read wordline, the control circuit 620 is configured to adjust the voltage level at the circuit node $CN_1$ in response to activation of the read wordline coupled to a memory cell in the column C[1], and keep the circuit node $CN_2$ floating. In operation, the control switch $SW_1$ can selectively couple the circuit node $CN_1$ to the reference voltage VR in response to activation of the read wordline coupled to the memory cell in the column C[1], while the control switch $SW_2$ can turn off according to the control signal $EN_2$ so as to keep the circuit node $CN_2$ floating. Similarly, in some embodiments where the column C[2] is selected and the column C[1] is unselected during activation of a read wordline, the control circuit 620 is configured to adjust the voltage level at the circuit node $CN_2$ in response to activation of an associated read wordline in the column C[2], and keep the circuit node $CN_1$ floating.

Figure 7:
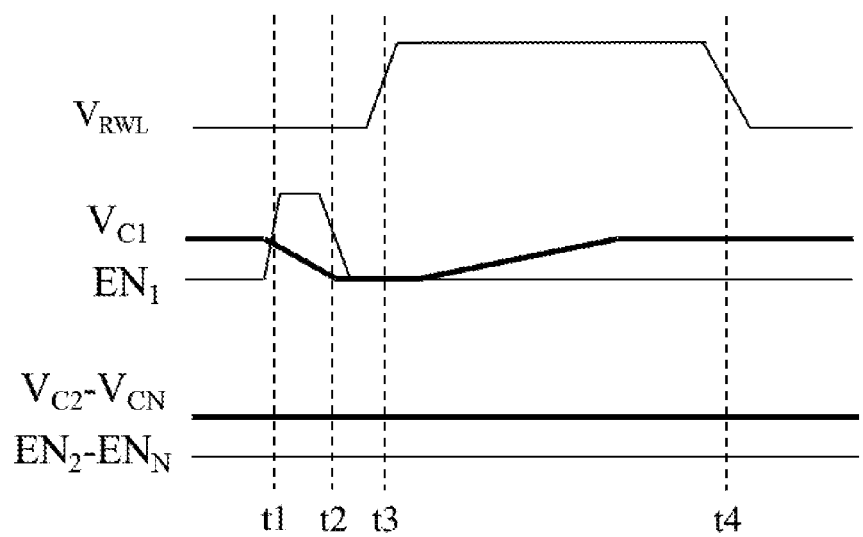
FIG. 7 illustrates exemplary waveforms of signals involved in operations for reading a memory cell in the column shown in FIG. 6 in accordance with some embodiments.

FIG. 7 illustrates exemplary waveforms of signals involved in operations for reading a memory cell in the column C[1] shown in FIG. 6 according to an embodiment of the present disclosure. In the embodiment shown in FIG. 7, during a read operation, the column C[1] shown in FIG. 6 is selected while other columns C[2]-C[N] shown in FIG. 6 are unselected. Each memory cell in the N columns C[1]-C[N] shown in FIG. 6 can employ the structure of the memory cell 201 shown in FIG. 2. Referring to FIG. 7 and also to FIG. 6, before a read wordline coupled to the memory cell is activated/asserted, the control switch $SW_1$ couples the circuit node $CN_1$ to the reference voltage VR for a period of time, e.g. a time period between time t1 and time t2, to discharge the circuit node $CN_1$. The voltage level $V_{C1}$ decreases accordingly. The circuit nodes $CN_2$-$CN_N$ coupled to unselected columns C[2]-C[N] are floating, and the voltage levels $V_{C2}$-$V_{CN}$ are substantially unchanged. During read wordline assertion, or a time period between time t3 and time t4, the control switch $SW_1$ uncouples the circuit node $CN_1$ from the reference voltage VR to make the voltage level $V_{C1}$ float, thus limiting a bitline voltage swing and reducing dynamic power.

As the control switch $SW_1$ may turn on for a short period of time before read wordline assertion, and the circuit nodes $CN_2$-$CN_N$ coupled to unselected columns C[2]-C[N] may be kept floating during the entire read operation in the selected column C[1], power consumption can be greatly reduced.

The above is for illustrative purposes only, and is not intended to limit the present disclosure. In some embodiments, the above-described footer control scheme (e.g. the control circuit 120 shown in FIG. 1) can be applied to memory devices performing single-ended reads. For example, in some alternative designs of the embodiment shown in FIG. 2, even if the transistors $M_{R3}$ and $M_{R4}$ and the complementary bitline RBLB are omitted in single-ended read applications, the control circuit 120 shown in FIG. 2 can be used to selectively adjust/float the voltage level $V_{C1}$ on the signal line SL to reduce a bitline voltage swing. Those skilled in the art will recognize that such equivalent constructions do not depart from the spirit and scope of the present disclosure.

Additionally or alternatively, the above-described footer control scheme can be applied to other memory structures such as a single-port or dual-port SRAM device. In some embodiments, the memory device shown in FIG. 1 can be implemented as a single-port SRAM device. When a bitline is selected to read data stored in a memory cell, the control circuit 120 shown in FIG. 1 can be configured to, in response activation of a wordline coupled to the memory cell, adjust a voltage level on a signal line being coupled to the selected bitline, thereby limiting a voltage swing on the selected bitline and reducing dynamic power. As a result, in addition to memory cells coupled to wordlines and bitlines which are dedicated to read operation, the footer control scheme can be applied to memory cells coupled to wordlines and bitlines which are not dedicated to read operation.

The footer control scheme can be shared between a sleep mode and a function mode of an SRAM device. In some embodiments where an SRAM device including the memory cell 201 shown in FIG. 2 operates in a sleep mode, the control circuit 120 shown in FIG. 2 may float the signal line SL to reduce leakage current from the read port portion. When the memory device including the memory cell 201 shown in FIG. 2 operates in a function mode, the control circuit 120 shown in FIG. 2 may make the voltage level $V_{C1}$ float with the voltage level $V_{RBL}$ on the read bitline RBL in response to activation of the read wordline RWL, wherein before the read wordline RWL is activated, the control circuit 120 may set the voltage level $V_{C1}$ to a predetermined level, i.e. a voltage level of the reference voltage VR.

Figure 8:
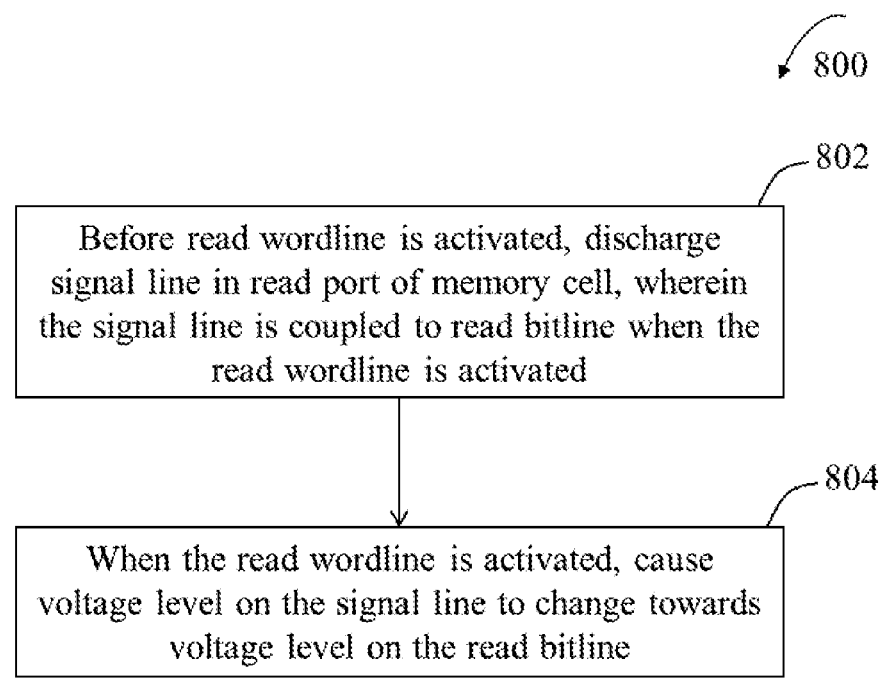
FIG. 8 is a flow chart of an exemplary method for reading a memory cell in accordance with some embodiments.

FIG. 8 is a flow chart of an exemplary method for reading a memory cell according to an exemplary embodiment of the present disclosure. The method 800 shown in FIG. 8 may be used for reading at least one of the memory cells MC shown in FIG. 1 and the memory cell 201 shown in FIG. 2. For illustrative purposes, the method 800 shown in FIG. 8 is described below with reference to the memory cell 201 shown in FIG. 2. In some embodiments, other operations in the method 800 can be performed. In some embodiments, operations of the method 800 can be performed in a different order and/or vary.

At operation 802, before a read wordline coupled to the memory cell is activated, a signal line in a read port of the memory cell is discharged, wherein the memory cell is further coupled to a read bitline, and the signal line is coupled to the read bitline when the read wordline is activated. For example, in the embodiment shown in FIG. 2 and FIG. 3, the signal line SL is coupled to the reference voltage VR before the read wordline RWL is activated.

At operation 804, when the read wordline is activated, a voltage level on the signal line is changed towards a voltage level on the read bitline. For example, in the embodiment shown in FIG. 2 and FIG. 3, the voltage level $V_{C1}$ floats with the voltage level $V_{RBL}$ during assertion of the read wordline RWL.

By dynamically adjusting, such as floating, a voltage level on a signal line being coupled to a selected bitline when an associated wordline is activated, all or most all of normal memory cells in a memory device would not be fully discharged in near-threshold applications. In addition, memory cells in unselected columns may kept floating during the entire read operation of a memory cell in a selected column, further reducing power consumption.

Some embodiments described herein may include a memory device that includes a plurality of memory cells and a control circuit. The memory cells are coupled to bitlines and wordlines. Each of the memory cells includes a first inverter, a second inverter, a first transistor and a second transistor. The first inverter and the second inverter are cross-coupled between a first data node and a second data node for data storage. The first transistor has a first control terminal, a first connection terminal and a second connection terminal. The first control terminal is coupled to a wordline, and the first connection terminal is coupled to a bitline. The second transistor has a second control terminal, a third connection terminal and a fourth connection terminal. The second control terminal is coupled to the first data node, and the third connection terminal is coupled to the second connection terminal. The control circuit is coupled to the fourth connection terminal, and is configured to, when the bitline is selected, adjust a voltage level at the fourth connection terminal in response to activation of the wordline.

Some embodiments described herein may include a memory device that includes a memory cell array, a first circuit node and a first control switch. The memory cell array has a plurality of memory cells arranged in columns and rows, and the memory cells are coupled to read bitlines and read wordlines. Each of the memory cells includes a latch, a first transistor and a second transistor. The latch has a first data node and a second data node for data storage. The first transistor has a first control terminal, a first connection terminal and a second connection terminal. The first control terminal is coupled to a read wordline, and the first connection terminal is coupled to a read bitline. The second transistor has a second control terminal, a third connection terminal and a fourth connection terminal. The second control terminal is coupled to the first data node, and the third connection terminal is coupled to the second connection terminal. The first circuit node is coupled to a first column of memory cells through respective fourth connection terminals of memory cells in the first column of memory cells. The first control switch is configured to, when a first read bitline coupled to the first column of memory cells is selected, selectively couple the first circuit node to a reference voltage in response to activation of a read wordline coupled to the first column of memory cells so as to adjust a voltage level at the first circuit node.

Some embodiments described herein may include a method for reading a memory cell. The memory cell is coupled to a read bitline and a read wordline. The method includes the following steps: before the read wordline is activated, discharging a signal line in a read port of the memory cell, wherein the signal line is coupled to the read bitline when the read wordline is activated; and when the read wordline is activated, cause a voltage level on the signal line to change towards a voltage level on the read bitline.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a plurality of memory cells coupled to bitlines and wordlines, each of the memory cells comprising:
      a first inverter and a second inverter cross-coupled between a first data node and a second data node for data storage;
      a first transistor having a first control terminal, a first connection terminal and a second connection terminal, the first control terminal being coupled to a wordline, the first connection terminal being coupled to a bitline; and
      a second transistor having a second control terminal, a third connection terminal and a fourth connection terminal, the second control terminal being coupled to the first data node, the third connection terminal being coupled to the second connection terminal; and
   a control circuit, coupled to the fourth connection terminal, the control circuit configured to, when the bitline is selected, adjust a voltage level at the fourth connection terminal in response to activation of the wordline;
   wherein when the bitline is selected and the read wordline is activated, the control circuit is configured to keep the fourth connection terminal floating to cause the voltage level at the fourth connection terminal to change towards a voltage level on the bitline.

2. The memory device of claim 1, wherein when the bitline is selected and before the wordline is activated, the control circuit is configured to discharge the fourth connection terminal.

3. The memory device of claim 1, wherein the control circuit comprises a control switch configured to selectively couple the fourth connection terminal to a reference voltage; before the wordline is activated, the control switch is configured to couple the fourth connection terminal to the reference voltage; when the wordline is activated, the control switch is configured to uncouple the fourth connection terminal from the reference voltage to cause the voltage level at the fourth connection terminal to float with the voltage level on the bitline.

4. The memory device of claim 3, wherein when the wordline is inactivated, the control circuit is configured to couple the fourth connection terminal to the reference voltage.

5. The memory device of claim 1, wherein respective fourth connection terminals of the memory cells are coupled to a shared circuit node of the control circuit, and the control circuit is configured to adjust a voltage level at the shared circuit node so as to adjust the voltage level at the fourth connection terminal.

6. The memory device of claim 1, wherein the memory cells comprises a first memory cell and a second memory cell; the bitline coupled to the first memory cell is separated from the bitline coupled to the second memory cell, while the wordline coupled to the first memory cell is shared with the second memory cell; the fourth connection terminal of the first memory cell is coupled to a first circuit node of the control circuit, and the fourth connection terminal of the second memory cell is coupled to a second circuit node of the control circuit separated from first circuit node; the control circuit is configured to adjust a voltage level at the first circuit node so as to adjust the voltage level at the fourth connection terminal of the first memory cell, and is configured to adjust a voltage level at the second circuit node so as to adjust the voltage level at the fourth connection terminal of the second memory cell.

7. The memory device of claim 6, wherein when the bitline coupled to the first memory cell is selected and the bitline coupled to the second memory cell is unselected, the control circuit is configured to adjust the voltage level at the first circuit node and the voltage level at the second circuit node in response to activation of the wordline coupled to the first memory cell.

8. The memory device of claim 6, wherein when the bitline coupled to the first memory cell is selected and the bitline coupled to the second memory cell is unselected, the control circuit is configured to adjust the voltage level at the first circuit node in response to activation of the wordline coupled to the first memory cell, and keep the second circuit node floating.

9. The memory device of claim 1, wherein each of the memory cells further comprises:
    a third transistor having a third control terminal, a fifth connection terminal and a sixth connection terminal, the third control terminal being coupled to the wordline, the fifth connection terminal being coupled to a complementary bitline; and
    a sixth transistor having a fourth control terminal, a seventh connection terminal and an eighth connection terminal, the fourth control terminal being coupled to the second data node, the seventh connection terminal being coupled to the sixth connection terminal, the eighth connection terminal being coupled to the fourth connection terminal.

10. A memory device, comprising:
    a memory cell array having a plurality of memory cells arranged in columns and rows, the memory cells being coupled to read bitlines and read wordlines, each of the memory cells comprising:
        a latch having a first data node and a second data node for data storage;
        a first transistor having a first control terminal, a first connection terminal and a second connection terminal, the first control terminal being coupled to a read wordline, the first connection terminal being coupled to a read bitline; and
        a second transistor having a second control terminal, a third connection terminal and a fourth connection terminal, the second control terminal being coupled to the first data node, the third connection terminal being coupled to the second connection terminal;
    a first circuit node coupled to a first column of memory cells through respective fourth connection terminals of memory cells in the first column of memory cells; and
    a first control switch configured to, when a first read bitline coupled to the first column of memory cells is selected, selectively couple the first circuit node to a reference voltage in response to activation of a read wordline coupled to the first column of memory cells so as to adjust a voltage level at the first circuit node;
    wherein when the first read bitline is selected and the read wordline coupled to the first column of memory cells is activated, the first control switch is configured to uncouple the first circuit node from the reference voltage to cause the voltage level at the first circuit node to float with a voltage level on the selected first read bitline.

11. The memory device of claim 10, wherein the voltage level on the selected first read bitline is greater than a voltage level of the reference voltage.

12. The memory device of claim 10, wherein before the read wordline coupled to the first column of memory cells is activated, the first control switch is configured to couple the first circuit node to the reference voltage.

13. The memory device of claim 12, wherein when the read wordline is inactivated, the first control switch is configured to couple the first circuit node to the reference voltage.

14. The memory device of claim 10, wherein the first circuit node is further coupled to a second column of memory cells through respective fourth connection terminals of memory cells in the second column of memory cells.

15. The memory device of claim 10, wherein the read wordline coupled to the first column of memory cells is shared with a second column of memory cells; the memory device further comprises:
    a second circuit node separated from the first circuit node, the second circuit node being coupled to respective fourth connection terminals of memory cells in the second column of memory cells; and
    a second control switch selectively coupled between the second circuit node and the reference voltage, the second control switch and the first control switch being controlled by a same control signal.

16. The memory device of claim 10, wherein the first control switch is controlled by a first control signal; the read wordline coupled to the first column of memory cells is shared with a second column of memory cells; the memory device further comprises:
    a second circuit node separated from the first circuit node, the second circuit node being coupled to respective fourth connection terminals of memory cells in the second column of memory cells; and
    a second control switch controlled by a second control signal different from the first control signal, the second control switch configured to, when a second read bitline coupled to the second column of memory cells is selected, selectively couple the second circuit node to the reference voltage in response to activation of a read wordline coupled to the second column of memory cells to adjust a voltage level at the second circuit node.

17. The memory device of claim 10, wherein each of the memory cells further comprises:
    a third transistor having a third control terminal, a fifth connection terminal and a sixth connection terminal, the third control terminal being coupled to the read wordline, the fifth connection terminal being coupled to a complementary read bitline; and
    a sixth transistor having a fourth control terminal, a seventh connection terminal and an eighth connection terminal, the fourth control terminal being coupled to the second data node, the seventh connection terminal being coupled to the sixth connection terminal, the eighth connection terminal being coupled to the fourth connection terminal.

18. A method for reading a memory cell, the memory cell being coupled to a read bitline and a read wordline, the method comprising:
    before the read wordline is activated, discharging a signal line in a read port of the memory cell, wherein the signal line is coupled to the read bitline when the read wordline is activated; and
    when the read wordline is activated, making a voltage level on the signal line change towards a voltage level on the read bitline.

19. The method of claim 18, wherein the discharging the signal line in the read port of the memory cell comprises:
   coupling the signal line to a reference voltage.

20. The method of claim 19, wherein the making the voltage level on the signal line change towards the voltage level on the read bitline comprises:
   uncoupling the signal line from the reference voltage in order to float the signal line.

* * * * *